(12) United States Patent
Ji et al.

(10) Patent No.: US 7,977,390 B2
(45) Date of Patent: * Jul. 12, 2011

(54) METHOD FOR PLASMA ETCHING PERFORMANCE ENHANCEMENT

(75) Inventors: Bing Ji, Pleasanton, CA (US); Erik A. Edelberg, Castro Valley, CA (US); Takumi Yanagawa, Fremont, CA (US); Zhisong Huang, Fremont, CA (US); Lumin Li, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 1308 days.

This patent is subject to a terminal disclaimer.

(21) Appl. No.: 11/508,725

(22) Filed: Aug. 22, 2006

(65) Prior Publication Data
US 2007/0026677 A1 Feb. 1, 2007

Related U.S. Application Data

(60) Continuation-in-part of application No. 10/946,181, filed on Sep. 20, 2004, now abandoned, which is a division of application No. 10/295,601, filed on Nov. 14, 2002, now Pat. No. 6,833,325.

(60) Provisional application No. 60/417,806, filed on Oct. 11, 2002.

(51) Int. Cl.
*B44C 1/22* (2006.01)
*H01L 21/302* (2006.01)

(52) U.S. Cl. ........... 516/67; 216/37; 216/41; 438/694; 438/706; 438/710; 438/723; 438/725

(58) Field of Classification Search .............. 216/41, 216/67, 37; 438/706, 710, 718, 723, 725, 438/694
See application file for complete search history.

(56) References Cited

U.S. PATENT DOCUMENTS

| | | | |
|---|---|---|---|
| 4,414,059 A | 11/1983 | Blum et al. | |
| 4,795,529 A | 1/1989 | Kawasaki et al. | |
| 4,985,114 A | 1/1991 | Okudaira et al. | |
| 5,024,722 A * | 6/1991 | Cathey, Jr. | 438/695 |
| 5,324,553 A * | 6/1994 | Ovshinsky et al. | 427/571 |
| 5,401,359 A | 3/1995 | Kadomura | |
| 5,468,342 A | 11/1995 | Nulty et al. | |
| 5,468,686 A | 11/1995 | Kawamoto | |
| 5,498,312 A | 3/1996 | Laermer et al. | |
| 5,501,893 A | 3/1996 | Laermer et al. | |
| 5,545,289 A | 8/1996 | Chen et al. | |

(Continued)

FOREIGN PATENT DOCUMENTS
CN 1241812 A 1/2000
(Continued)

OTHER PUBLICATIONS

Office Action dated Jan. 12, 2007 for U.S. Appl. No. 10/946,181.
(Continued)

*Primary Examiner* — Shamim Ahmed
(74) *Attorney, Agent, or Firm* — Beyer Law Group LLP

(57) ABSTRACT

A method for etching features in a dielectric layer is provided. A mask is formed over the dielectric layer. A protective silicon-containing coating is formed on exposed surfaces of the mask. The features are etched through the mask and protective silicon-containing coating. The features may be partially etched before the protective silicon-containing coating is formed.

18 Claims, 12 Drawing Sheets

U.S. PATENT DOCUMENTS

| | | | |
|---|---|---|---|
| 5,562,801 A | 10/1996 | Nulty | |
| 5,882,535 A | 3/1999 | Stocks et al. | |
| 5,942,446 A | 8/1999 | Chen et al. | |
| 6,025,255 A | 2/2000 | Chen et al. | |
| 6,046,115 A | 4/2000 | Molloy et al. | |
| 6,051,503 A | 4/2000 | Bhardwaj et al. | |
| 6,057,242 A * | 5/2000 | Kishimoto | 438/692 |
| 6,071,822 A | 6/2000 | Donohue et al. | |
| 6,074,959 A | 6/2000 | Wang et al. | |
| 6,100,200 A | 8/2000 | Van Buskirk | |
| 6,127,258 A | 10/2000 | Watanabe et al. | |
| 6,127,273 A * | 10/2000 | Laermer et al. | 438/709 |
| 6,187,666 B1 | 2/2001 | Singh et al. | |
| 6,187,685 B1 | 2/2001 | Hopkins et al. | |
| 6,200,822 B1 | 3/2001 | Becker et al. | |
| 6,211,092 B1 | 4/2001 | Tang et al. | |
| 6,214,161 B1 | 4/2001 | Becker et al. | |
| 6,261,962 B1 | 7/2001 | Bhardwaj et al. | |
| 6,284,148 B1 | 9/2001 | Laermer et al. | |
| 6,284,666 B1 * | 9/2001 | Naeem et al. | 438/713 |
| 6,291,357 B1 | 9/2001 | Zhang et al. | |
| 6,303,512 B1 | 10/2001 | Laermer et al. | |
| 6,316,169 B1 | 11/2001 | Vahedi et al. | |
| 6,326,307 B1 | 12/2001 | Lindley et al. | |
| 6,376,382 B1 | 4/2002 | Chiou et al. | |
| 6,387,287 B1 | 5/2002 | Hung et al. | |
| 6,403,491 B1 | 6/2002 | Liu et al. | |
| 6,406,995 B1 | 6/2002 | Hussein et al. | |
| 6,444,568 B1 * | 9/2002 | Sundararajan et al. | 438/627 |
| 6,488,862 B1 | 12/2002 | Ye et al. | |
| 6,489,632 B1 | 12/2002 | Yamazaki et al. | |
| 6,500,743 B1 | 12/2002 | Lopatin et al. | |
| 6,518,192 B2 | 2/2003 | Khan et al. | |
| 6,537,906 B1 | 3/2003 | Mori | |
| 6,569,774 B1 | 5/2003 | Trapp | |
| 6,617,253 B1 | 9/2003 | Chu et al. | |
| 6,632,903 B2 | 10/2003 | Jung et al. | |
| 6,647,994 B1 | 11/2003 | Lui et al. | |
| 6,833,325 B2 * | 12/2004 | Huang et al. | 438/714 |
| 6,846,516 B2 | 1/2005 | Yang et al. | |
| 6,916,746 B1 * | 7/2005 | Hudson et al. | 438/706 |
| 2001/0012694 A1 | 8/2001 | Coburn et al. | |
| 2002/0033191 A1 * | 3/2002 | Kondo et al. | 136/249 |
| 2002/0179570 A1 * | 12/2002 | Mathad et al. | 216/67 |
| 2003/0027427 A1 | 2/2003 | Ma et al. | |
| 2003/0162395 A1 | 8/2003 | Trapp | |
| 2003/0189024 A1 | 10/2003 | Khan et al. | |
| 2004/0072430 A1 | 4/2004 | Huang et al. | |
| 2004/0221797 A1 | 11/2004 | Mosden et al. | |
| 2004/0224520 A1 | 11/2004 | Yun et al. | |
| 2005/0037624 A1 | 2/2005 | Huang et al. | |
| 2005/0048789 A1 | 3/2005 | Merry et al. | |
| 2005/0136682 A1 | 6/2005 | Hudson et al. | |
| 2005/0266682 A1 | 12/2005 | Chen et al. | |

FOREIGN PATENT DOCUMENTS

| | | |
|---|---|---|
| DE | 10059836 | 6/2002 |
| EP | 0268021 | 5/1988 |
| EP | 0363982 | 4/1990 |
| EP | 0822582 | 2/1998 |
| JP | S63-13334 | 1/1988 |
| JP | 04-240729 A | 8/1992 |
| JP | 07226397 | 8/1995 |
| JP | 09036089 | 2/1997 |
| JP | 2001068462 | 3/2001 |
| TW | 505984 | 10/2002 |
| TW | 538476 | 6/2003 |
| WO | 00/30168 | 5/2000 |
| WO | 01/04707 | 1/2001 |
| WO | 01/29879 A2 | 4/2001 |
| WO | 01/29879 A3 | 4/2001 |
| WO | 2004/034445 | 4/2004 |

OTHER PUBLICATIONS

Search Report dated Nov. 12, 2009 from Singapore Patent Application No. 200705771-4.
Written Opinion dated Nov. 12, 2009 from Singapore Patent Application No. 200705771-4.
Office Action dated Feb. 2, 2010 from Japanese Application No. 2006-509625.
Final Office Action dated Dec. 17, 2009 from U.S. Appl. No. 11/357,548.
Notice of Allowance dated Aug. 13, 2007 for U.S. Appl. No. 10/860,833.
Notice of Allowance dated Oct. 12, 2006 from U.S. Appl. No. 10/674,675.
Office Action dated Jun. 22, 2007 for U.S. Appl. No. 11/055,878.
Office Action dated Sep. 20, 2007 for U.S. Appl. No. 11/055,878.
Office Action dated Apr. 10, 2008 for U.S. Appl. No. 11/055,878.
Office Action dated Oct. 17, 2006 for U.S. Appl. No. 10/860,833.
Office Action dated Apr. 4, 2007 for U.S. Appl. No. 10/860,833.
Australian Search Report dated Feb. 25, 2008 for Singapore Patent Application No. 200608124-4.
Written Opinion dated Feb. 25, 2008 for Singapore Patent Application No. 200608124-4.
Indian Office Action dated Jan. 31, 2008 from Indian Patent Application No. 2004/KOLNP//2005.
Office Action dated Mar. 20, 2009 from U.S. Appl. No. 11/055,878.
Office Action dated May 7, 2009 from U.S. Appl. No. 11/357,548.
Taiwan Office Action dated Mar. 31, 2009 from Taiwan Patent Application No. 92128179.
International Search Report dated Jun. 11, 2007 from PCT/US2007/002511.
Written Opinion dated Jun. 11, 2007 from PCT/US2007/002511.
Office Action dated Nov. 4, 2008 from U.S. Appl. No. 11/055,878.
Office Action dated Nov. 5, 2008 from U.S. Appl. No. 11/357,548.
Israeli Office Action dated May 3, 2009 from Israeli Patent Application No. 171270.
European Examination Report dated Jul. 13, 2009 from European Patent Application No. 05760834.1.
Final Office Action dated Sep. 11, 2009 from U.S. Appl. No. 11/055,878.
Examination Report dated Sep. 16, 2009 from European Application No. 03 774 602.1.
International Search Report, dated Feb. 24, 2004.
International Search Report, dated Sep. 10, 2004.
International Search Report and Written Opinion, dated Oct. 7, 2005.
Office Action mailed on Jun. 23, 2005 for U.S. Appl. No. 10/674,675.
Office Action mailed on Nov. 15, 2005 for U.S. Appl. No. 10/674,675.
Office Action mailed on Apr. 12, 2006 for U.S. Appl. No. 10/674,675.
Office Action mailed on May 11, 2006, U.S. Appl. No. 10/860,833.
Eto et al., "High Selectivity Photoresist Ashing by the Addition of $NH_3$ to $CF_4/O_2$ or $CHF_3/O_2$", SID 99 Digest, pp. 844-847.
Office Action and Search Report dated Oct. 25, 2010 from Taiwan Patent Application No. 093109498.
Final Office Action dated Oct. 15, 2010 from U.S. Appl. No. 11/357,548.
Exam Report dated Nov. 9, 2010 from Singapore Patent Application No. 200705771-4.
Office Action dated May 3, 2010 from U.S. Appl. No. 11/357,548.
Office Action dated Apr. 14, 2010 from Chinese Patent Application No. 200380105311.4.
Supplementary Search Report dated Sep. 10, 2010 from European Patent Application No. 04759091.4.

* cited by examiner

METHOD FOR PLASMA ETCHING PERFORMANCE ENHANCEMENT

RELATED APPLICATIONS

This is a Continuation-In-Part of prior U.S. application Ser. No. 10/946,181 entitled "METHOD FOR PLASMA ETCHING PERFORMANCE ENHANCEMENT", filed on Sep. 20, 2004 now abandoned, which is a divisional application of U.S. application Ser. No. 10/295,601, filed Nov. 14, 2002, now U.S. Pat. No. 6,833,325, entitled "METHOD FOR PLASMA ETCHING PERFORMANCE ENHANCEMENT", issued on Dec. 21, 2004, which claims priority under 35 USC 119(e) from the Provisional Application No. 60/417,806 entitled "IN-SITU PLASMA VAPOR DEPOSITION AND ETCH METHOD FOR PLASMA ETCH PERFORMANCE ENHANCEMENT," which was filed on Oct. 11, 2002, which are all hereby incorporated by reference.

BACKGROUND OF THE INVENTION

1. Field of the Invention

The invention relates to a method of obtaining a structure on a semiconductor wafer by etching through structures defined by an etch mask using a plasma.

2. Description of the Related Art

In semiconductor plasma etching applications, a plasma etcher is usually used to transfer a photoresist mask pattern into a circuit and line pattern of a desired thin film and/or filmstack (conductors or dielectric insulators) on a Si wafer. This is achieved by etching away the films (and filmstacks) underneath the photoresist materials in the opened areas of the mask pattern. This etching reaction is initiated by the chemically active species and electrically charged particles (ions) generated by exciting an electric discharge in a reactant mixture contained in a vacuum enclosure also referred to as a reactor chamber. Additionally, the ions are also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping it away, leaving in its place a replica of the lateral pattern of the original intended mask patterns. During the etching process, the mask materials are usually eroded and/or damaged in exchange for the pattern transfer. Consequently, some of the damage and erosion also may be transferred to the underlying layers leaving such undesirable pattern distortions such as striation, CD enlargement, etc.

The objective of the etching methodology, therefore, includes reducing the photoresist mask erosion to enhance the fidelity of the pattern transfer from the photoresist mask patterns.

In a dielectric etch, the aspect ratio (AR) is defined as the ratio between the feature depth (d) and width (w1) as shown in FIG. 9, which shows a photoresist mask 904 over a dielectric layer 908 over a silicon nitride barrier layer 910. The dielectric layer 908 has been etched forming features 916, which have bowed sidewalls. In high aspect ratio (HAR) dielectric etch, where AR is greater than 10, one must meet many competing requirements:

High etch selectivity between the dielectric layer and the mask layer

Vertically straight feature profile

Control of the critical dimensions (CD)

Higher etch selectivity is needed to preserve the mask pattern throughout the etch process, and prevent undesirable irregular deviations (striations) in the etch profile. A vertically straight feature profile is necessary to maintain device yield. There are several mechanisms to cause deviations from the vertically straight profile: bowing refers to widening in the upper-middle portion of the feature (w2>w1 in FIG. 9); necking refers to narrowing near the top of the feature (w4<w1 in FIG. 10); tapering refers to narrowing towards the bottom of the feature (w2>w3); and twisting refers to random deviation of the position and orientation at the bottom of the feature or the distortion of the bottom shape, leading to misalignment to the underlying active devices. The bowing depth $d_B$ is shown as the depth where bowing occurs, as shown. CD control has become increasingly critical as feature sizes continue to shrink. Often times, reduction or shrink of the CD from the values defined in the mask must be achieved during HAR etch.

FIG. 10 is a schematic view of another etch performed using conventional techniques to form features 1016. In this example, a necking occurs to form a feature width w4, before a bowing occurs forming a feature width w2.

Efforts have been made in the prior art to solve these problems. One of the most challenging problem is bow protection, or to eliminate vertical profile bowing. A common conventional method is to use polymerizing fluorocarbon chemistry to passivate the feature sidewalls during plasma etch. However, this approach is limited by the complex competing chemistries, and trade-offs between bow protection and etch stop. As aspect ratio further increases, this conventional method has become inadequate for bow protection. Variations in sidewall passivation (deposition) while etching have been explored, for example: Providing passivation additives during an etch step increases the propensity for polymerization during plasma etch, leading to enhanced sidewall passivation and bow protection. However, the etch chemistry becomes even more complicated, and consequently more susceptible to trade-off limitations such as etch stop.

SUMMARY OF THE INVENTION

To achieve the foregoing and in accordance with the purpose of the present invention, a method for etching features in a dielectric layer is provided. A mask is formed over the dielectric layer. A protective silicon-containing coating is formed on exposed surfaces of the mask. The features are etched through the mask and protective silicon-containing coating.

In another manifestation of the invention a method of etching features in a dielectric layer is provided. A mask is formed over a dielectric layer. Features are partially etched into the dielectric layer. A protective silicon-containing coating is formed on sidewalls of the partially etched features. The features are completely etched.

In another manifestation of the invention an apparatus for forming features in a dielectric layer disposed below a mask is provided. A plasma processing chamber, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source is in fluid connection with the gas inlet, where the gas source comprises a silicon-containing deposition gas source and an etching gas source. A controller is controllably connected to the gas source and the at least one electrode and comprises at least one processor and computer readable media. The computer readable media comprises computer readable code for forming a silicon containing coating on exposed surfaces of the mask, comprising computer readable code for providing a silicon-containing deposition gas from the silicon-containing gas source, computer readable code for forming the silicon-containing deposition gas into a plasma, computer readable code for depositing a silicon-containing layer from the plasma on exposed surface of the mask, and computer readable code for terminating the providing the silicon-containing deposition gas from the silicon-containing gas source. The computer readable media further comprises computer readable code for etching features through the mask and protective silicon containing layer, comprising computer readable code for providing an etch gas from the etch gas source, computer readable code for forming the etch gas into a plasma, which etches features into the dielectric layer, and computer readable code for terminating the providing the etch gas from the etch gas source.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides an etch with a non-etching step where a silicon-containing layer is deposited to allow improved mask to dielectric etch selectivity and/or reduce bowing to provide more vertical profiles. More preferably, the invention provides high etch selectivities to allow the etching of high aspect ratio (HAR) features in a dielectric layer with a ratio of a feature depth to feature width greater than 10:1, in addition to vertically straight feature profile (sidewalls) and control of critical dimension (CD). Preferably, the vertical sidewalls are sidewalls that from bottom to top make an angle between 88° to 90° with the bottom of the features.

Higher selectivity preserves the mask to allow for thinner mask patterns for improved resolution and prevents undesirable irregular deviations (striations) in the etch profile.

Figure 1:
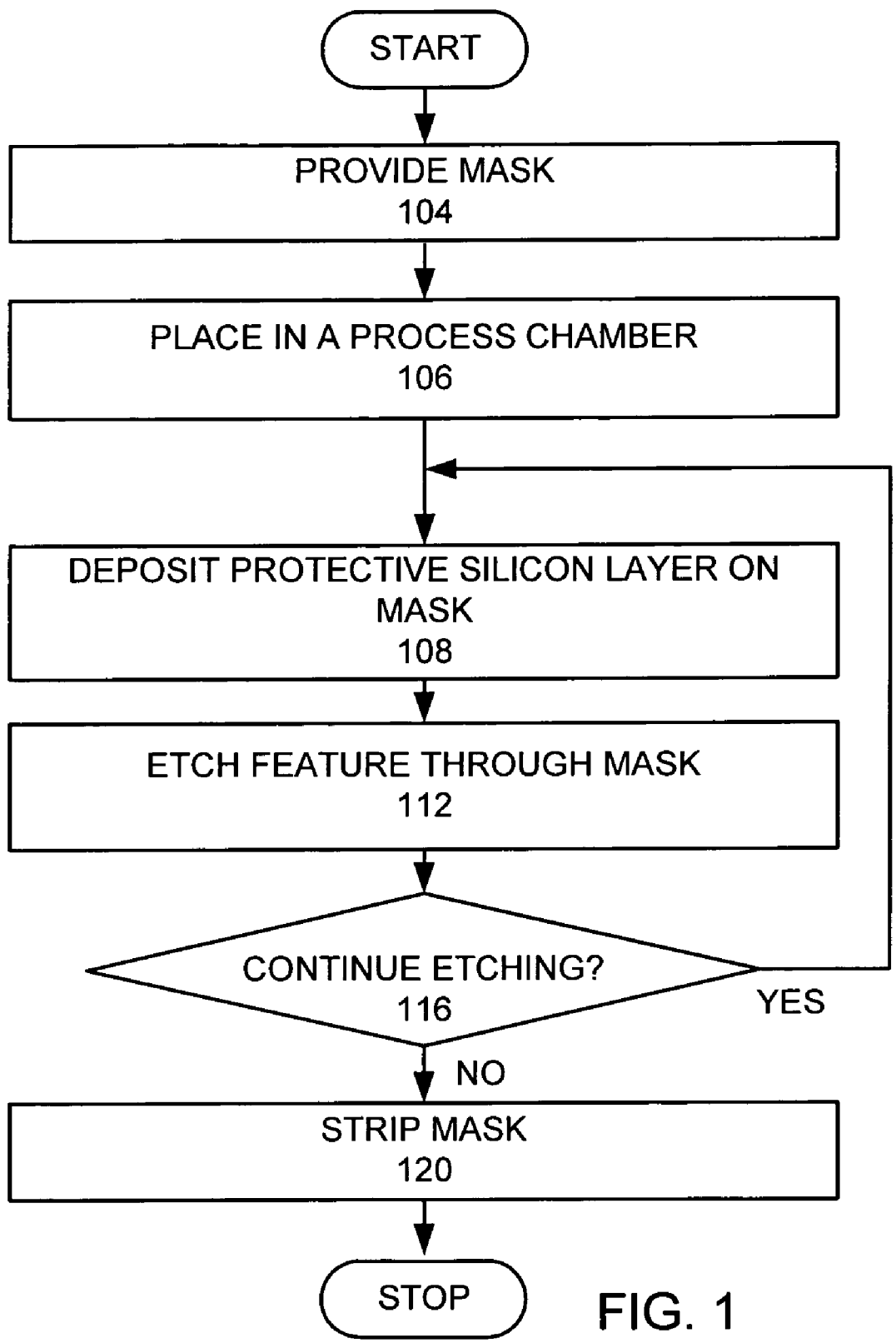
FIG. 1 is a flow chart of an inventive etch process.
Figure 2A:
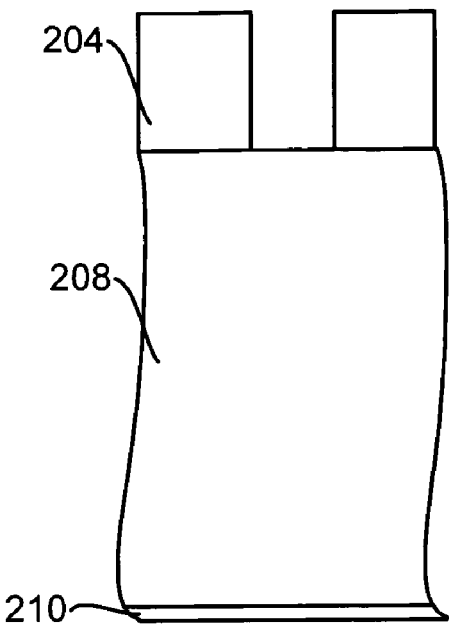
FIGS. 2A-F are schematic views of the formation of a feature using the inventive process.

The inventive etch process may be implemented through various embodiments. To facilitate understanding, FIG. 1 is a high level flow chart that may be used in some embodiments of the invention. A mask is provided on a layer to be etched (step 104). FIG. 2A shows a mask 204, which has been formed on a dielectric layer 208 to be etched which is over a silicon nitride barrier layer 210, which is on a substrate. The substrate is placed in a process chamber (step 106).

Figure 3:
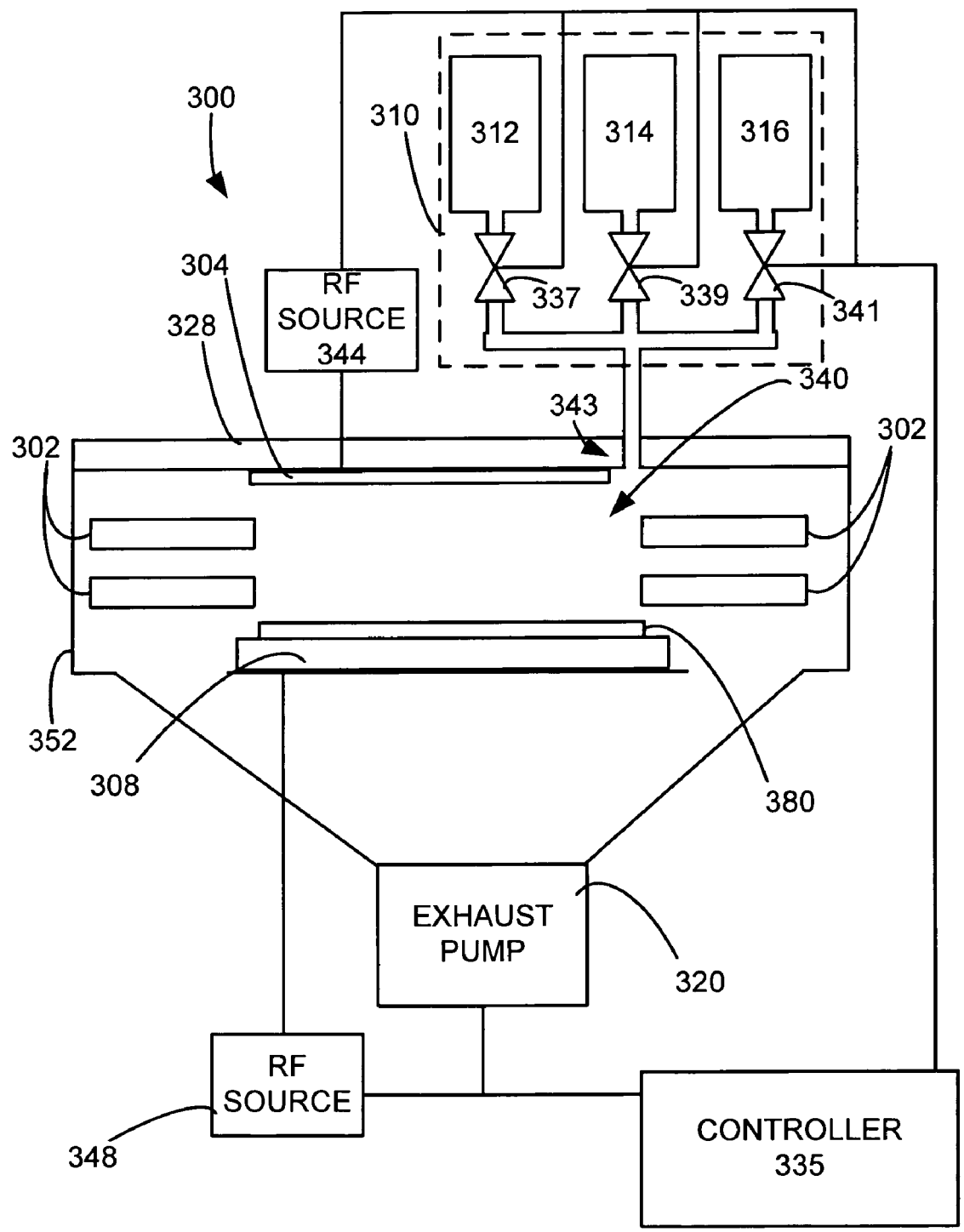
FIG. 3 is a schematic view of a system that may be used in practicing the invention.

FIG. 3 is a schematic view of a process chamber 300 that may be used in the preferred embodiment of the invention. In this embodiment, the plasma processing chamber 300 comprises confinement rings 302, an upper electrode 304, a lower electrode 308, a gas source 310, and an exhaust pump 320. The gas source 310 comprises a deposition gas source 312, an etchant gas source 314, and an additional gas source 316. Within plasma processing chamber 300, the substrate wafer 380 is positioned upon the lower electrode 308. The lower electrode 308 incorporates a suitable substrate chucking mechanism (e.g., electrostatic, mechanical clamping, or the like) for holding the substrate wafer 380. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume through the confinement rings 302 and an exhaust port by the exhaust pump 320. The exhaust pump 320 forms a gas outlet for the plasma processing chamber. A first RF source 344 is electrically connected to the upper electrode 304. A second RF source 348 is electrically connected to the lower electrode 308. Chamber walls 352 define a plasma enclosure in which the confinement rings 302, the upper electrode 304, and the lower electrode 308 are disposed. Both the first RF source 344 and the second RF source 348 may comprise a 60 MHz power source, a 27 MHz power source, and a 2 MHz power source. Different combinations of connecting RF power to the electrode are possible. A 300 mm Flex45 front end dielectric etcher made by LAM Research Corporation™ of Fremont, Calif. may be used in a preferred embodiment of the invention. A controller 335 is controllably connected to the first RF source 344, the second RF source 348, the exhaust pump 320, a first control valve 337 connected to the deposition gas source 312, a second control valve 339 connected to the etchant gas source 314, and a third control valve 341 connected to the additional gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations.

Figure 4A:
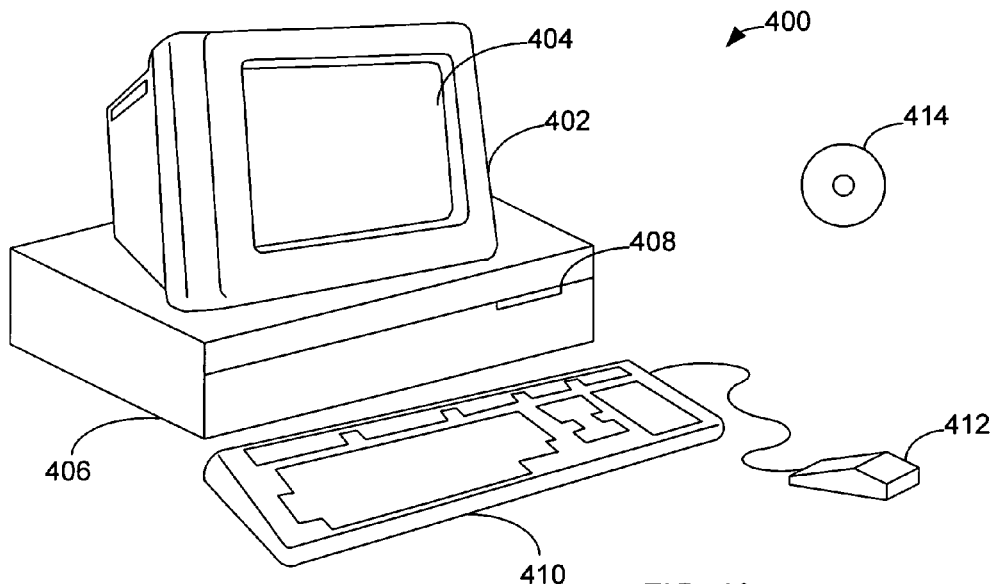
FIGS. 4A-B are schematic views of a computer system that may be used in practicing the invention.
Figure 4B:
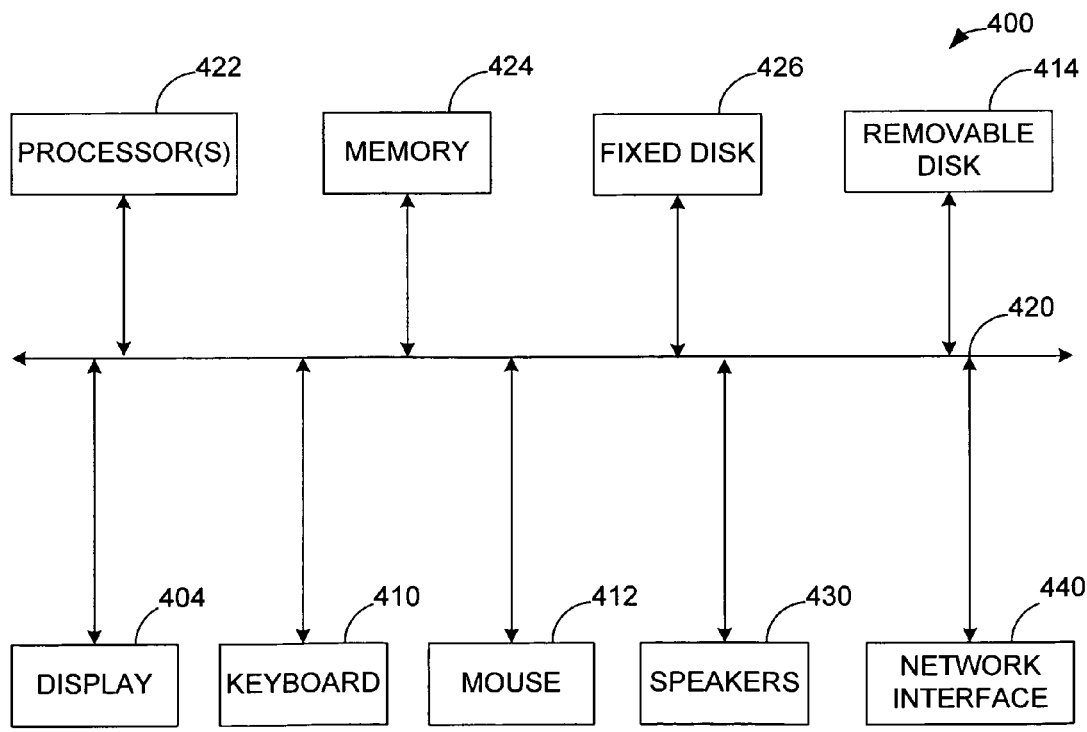

FIGS. 4A and 4B illustrate a computer system 400, which is suitable for using as the controller 335. FIG. 4A shows one possible physical form of a computer system that may be used for the controller 335. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 may be also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
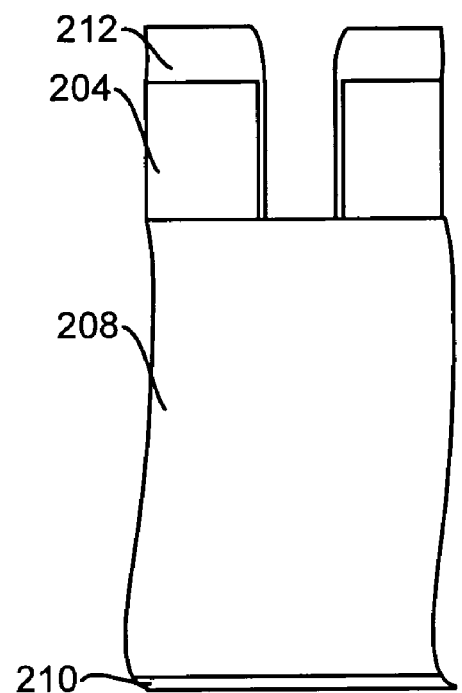

A protective silicon-containing layer 212 is formed on the mask 204, as shown in FIG. 2B (step 108). It is preferred that the protective silicon-containing layer is formed using a silicon precursor gas comprising $SiF_4$. Without being bound by theory, it is believed that $SiF_4$ provides both silicon, which is deposited for the silicon-containing protective layer, and fluorine, which provides some profile shaping of the silicon layer, and prevents etch stop at the bottom of the features to be etched. It is preferred that the deposition be asymmetric so that the amount of deposition is formed preferentially more on the masking material and feature sidewalls than on the bottom of the etched dielectric features. As can be seen in FIG. 2B, a thicker protective silicon layer 212 is formed on the top of the mask 204 than on the dielectric surface on the bottom of the feature. Preferably, as shown in FIG. 2B, the fluorine removes the silicon on the bottom of the feature. In the preferred embodiment, the deposition is done in-situ in an etch chamber using a chemical vapor deposition (CVD) process, which also deposits a thin protective layer on the sidewall of the mask. Preferably, the deposition uses some ion energy to allow for selectivity of such deposition. When the deposition is completed, the flow of the deposition gas may be stopped.

In other embodiments, the processing conditions may be changed to vary the thickness and spatial distribution of the silicon protective layer. For example, it may be desirable to form a thicker coating on the sidewall of the etching structures as the etching proceeds deeper in order to protect the etching structure from further distortion or bowing by the subsequent etching. A variation of processing conditions may provide for this. Since depositing the protective silicon layer and etching are separate steps, the process conditions for depositing the protective silicon-containing layer may be optimized for this result without interfering with the etching process.

Examples of deposition chemistries that may be used for CVD deposition of the silicon-containing protective layer may be, but are not limited to $SiH_4$, $Si(CH_3)_4$, $SiH(CH_3)_3$, $SiH_2(CH_3)_2$, $SiH_3(CH_3)$, $Si(C_2H_5)_4$, $SiF_4$, and other organo-silicon compounds such as $Si(OC_2H_5)_4$. It is preferred that these chemicals have a halogen to silicon ratio of no greater than 4:1. $SiF_4$ is the most preferred precursor because it is nonflammable and readily available/present in semiconductor production fabs. To release silicon from $SiF_4$ for deposition, a fluorine scavenger such as hydrogen ($H_2$) is added in the deposition plasmas. For $SiF_4$ deposition, adequate amount of hydrogen $H_2$ is needed. The ratio of $H_2$ to $SiF_4$ flow rates is in the range of 0.5-5, and the preferred range is 1.5 to 2.5.) Carbon-containing precursors such as $CH_4$ and/or $CF_4$ can also be added to change the film composition. For mask and bow protection, the deposition must be conformal over the mask and feature sidewalls. At the same time, to prevent etch stop, the deposition must be inhibited or impeded at the bottom of the features. In addition, the deposition must be uniform over the entire wafer surface.

The deposited protective layer is an amorphous silicon containing layer (or polymorphous silicon) over the mask. The silicon protective layer is modified with the presence of some F, C, and H components. The presence of F causes selective activity on different material surfaces such that deposition occurs preferentially on some but not the other surfaces. For example, deposition is more preferential on the mask surfaces and on the sidewalls of the etched features than on the bottom of the etched dielectric features. Preferential deposition on the mask surfaces results in mask protection and improves etch selectivity. Preferential deposition on the sidewalls of the etched features inhibits lateral etching, hence minimizes bowing of the etched features.

The deposition of the silicon-containing protective layer is an independent step in the etch process which may include different combinations of deposition gases for different etching applications of different materials, where the deposition provides a silicon-containing protective coating around the etching features, including the masking features, using possible multistep gas switching sequences. To accomplish this step, the controller 335 may cause the first control valve 337 to allow a $SiF_4$ containing deposition gas from the deposition gas source 312 into the process chamber 300, while causing the second control valve 339 from preventing etching gas from the etchant gas source 314 from entering the process chamber. The controller 335 may also control the power supplied by the first and second RF sources 344, 348 and the exhaust pump 320. The controller may also be used to control the wafer area pressure, backside He cooling pressure, the bias on the substrate, and various temperatures.

Figure 2C:
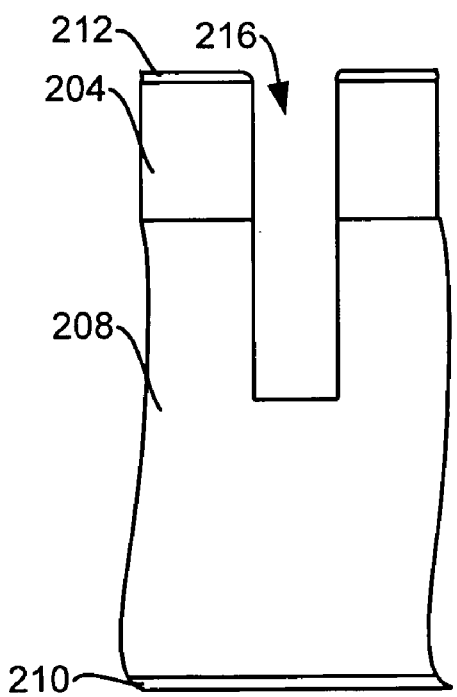

Next, the dielectric layer 208 is etched through the mask 204, to form the feature 216, as shown in FIG. 2C. Etching applications may include, but are not limited to, a dielectric cell etch, a dielectric contact etch (high aspect ratio contact (HARC) or damascene), conductor trench etch (shallow or deep), self-aligned contact etch, gate mask open etch, contact etch, via dielectric etch, dual-damascene via etch, dual damascene trench etch, conductor gate etch, conductor deep trench etch, conductor shallow trench isolation etch, and hardmask opening. Preferably, the etch uses a high ion energy to provide a directional etch. The etch may remove some of the protective silicon-containing layer 212, as shown. All of the protective layer on some of the surfaces may be removed. In this example, the protective layer forming the side wall on the mask 204 has been removed. Other parts of the protective silicon-containing layer may only be partially removed. In this example, only part of the protective silicon-containing layer 212 on the top surface of the mask 204 has been removed. In other embodiments, other parts of the protective layer may be partially etched way or completely etched away. To accomplish this step, the controller 335 may cause the first control valve 337 to stop the flow of the deposition gas from the deposition gas source 312 into the process chamber 300, while causing the second valve 339 to allow the etching gas from the etchant gas source 314 to flow into the process chamber. The controller 335 may change the power supplied by the first and second RF sources 344, 348 and change the setting of the exhaust pump 320 to accommodate the etching. The controller may also be used to change the wafer area pressure, backside pressure, and various temperatures to accommodate the etching process.

Figure 2D:
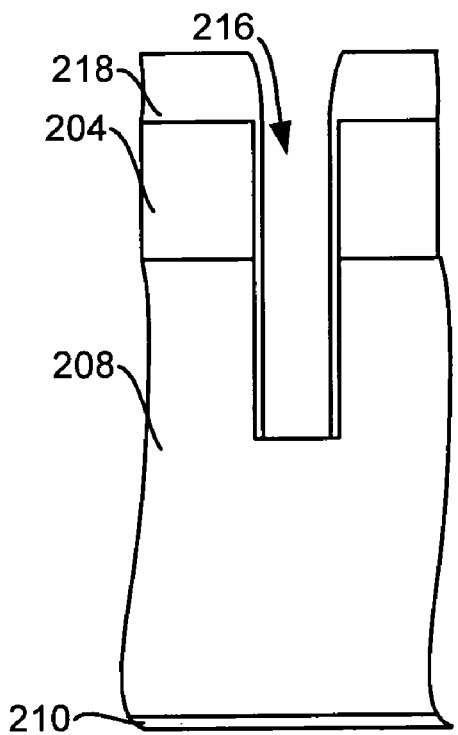

After the feature is at least partially etched, a determination is made on whether to etch more (step 116). This may be done by a set recipe or by taking a measurement. If more etching is desired, then the process cycles back to step 108, where an additional silicon protective layer 218 is deposited on the mask, as shown in FIG. 2D. In this example, the remaining part of the old protective layer becomes part of the new protective silicon layer 218. In this step, again the controller 335 opens the first control valve 337 to provide deposition gas and closes the second control valve 339 to stop the flow of the etching gas. The controller 335 may also change other parameters to accommodate the deposition.

Figure 2E:
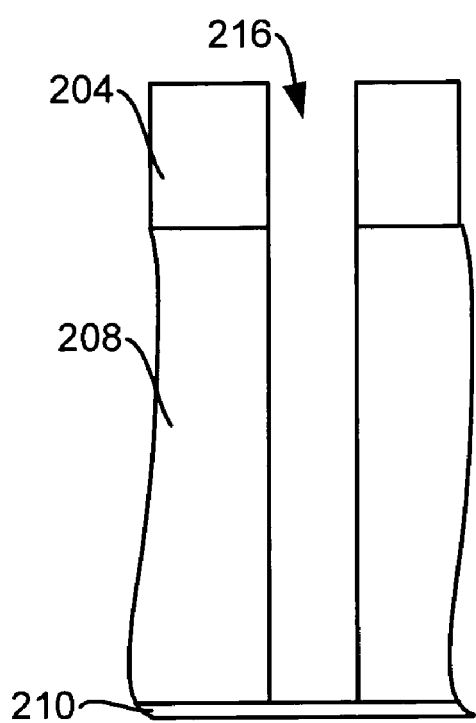
Figure 2F:
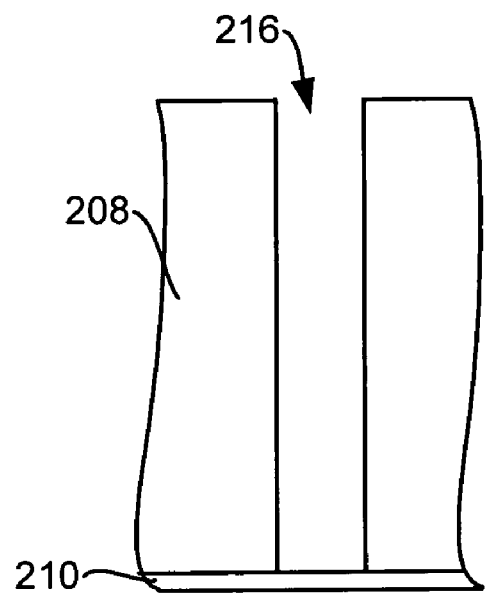

The feature is then further etched through the mask (step 112), providing a deeper feature 216, as shown in FIG. 2E. In this step, again the controller 335 closes the first control valve 337 to stop the deposition gas and opens the second control valve 339 to allow the flow of the etching gas. The controller 335 may also change other parameters to accommodate the etching.

Preferably, this cycle or loop of providing alternating deposition and etching steps is repeated more than once. Preferably, this cycle is repeated more than three times. Preferably, this cycle is repeated at least five times. This cycle may be repeated dozens of times. It may be desirable to repeat this cycle 100 times.

In other embodiments, an etch step may be added before step 108 for depositing a silicon protective layer on the mask.

Preferably, the etching and the deposition of the protective layer are done in the same chamber, but may be done in different chambers. Since the deposition and etch are done in the same chamber, cycling between the deposition and etch may be done quickly.

Preferably, the mask is an organic material, wherein organic material is defined as a photoresist, polymer, or amorphous carbon. Inorganic materials can also be used as mask. Examples of inorganic material mask for dielectric etching include poly-silicon mask and metal oxide mask. Examples of materials for the organic material mask may include, but are not limited to the newer generation of photoresist, such as, deep UV photoresist, 193 nm photoresist, 157 nm photoresist, EUV photoresist, e-beam photoresist, and x-ray photoresist, and other non-lithographic masks such as amorphous carbon. The older generation of photoresist polymer materials are designed to contain unsaturated C—C bonds, such as the C—C double bond and even C—C triple bonds to provide the required high etching resistance, namely, chemical inertness to the etching gas mixture. These bonds are strong and require a high activation energy to break and therefore, at relatively low ion energies, the older generation photoresist can show remarkably low etching rate to the etching gas mixture. The newer generation of photoresist, including 193 nm and 157 nm, does not contain these unsaturated bonds because these unsaturated bonds absorb at the lithography exposure wavelength, leading to much reduced photoresist etching resistance. By providing a silicon-containing protective coating on the photoresist during the etching phase, the etching resistance of the photoresist is much improved, even at high ion bombardment energy. The high ion bombardment energies at which the invention may improve etching resistance of the mask may be 50-2,000 eV. More preferably, the ion bombardment energy may be 200-1,500 eV. Most preferably, the ion bombardment energy is 500-1,000 eV.

In this embodiment, an in-situ plasma chemical process is used to enhance and/or repair the mask, as well as the vertical sidewalls of etching features, during the etching progression. In this embodiment, a plasma chemical deposition process is initiated for a short duration before and/or after the wafer is exposed to an etching plasma for a desired duration. The deposition process is chosen in such a way that a thin film of silicon is formed on the mask pattern to protect the mask from later etch erosion. This changes the surface composition of the mask pattern such that the mask behaves like a pseudo hardmask, having certain beneficial etching characteristics of a silicon hardmask.

Single Etch Deposition Etch Cycle

Figure 5:
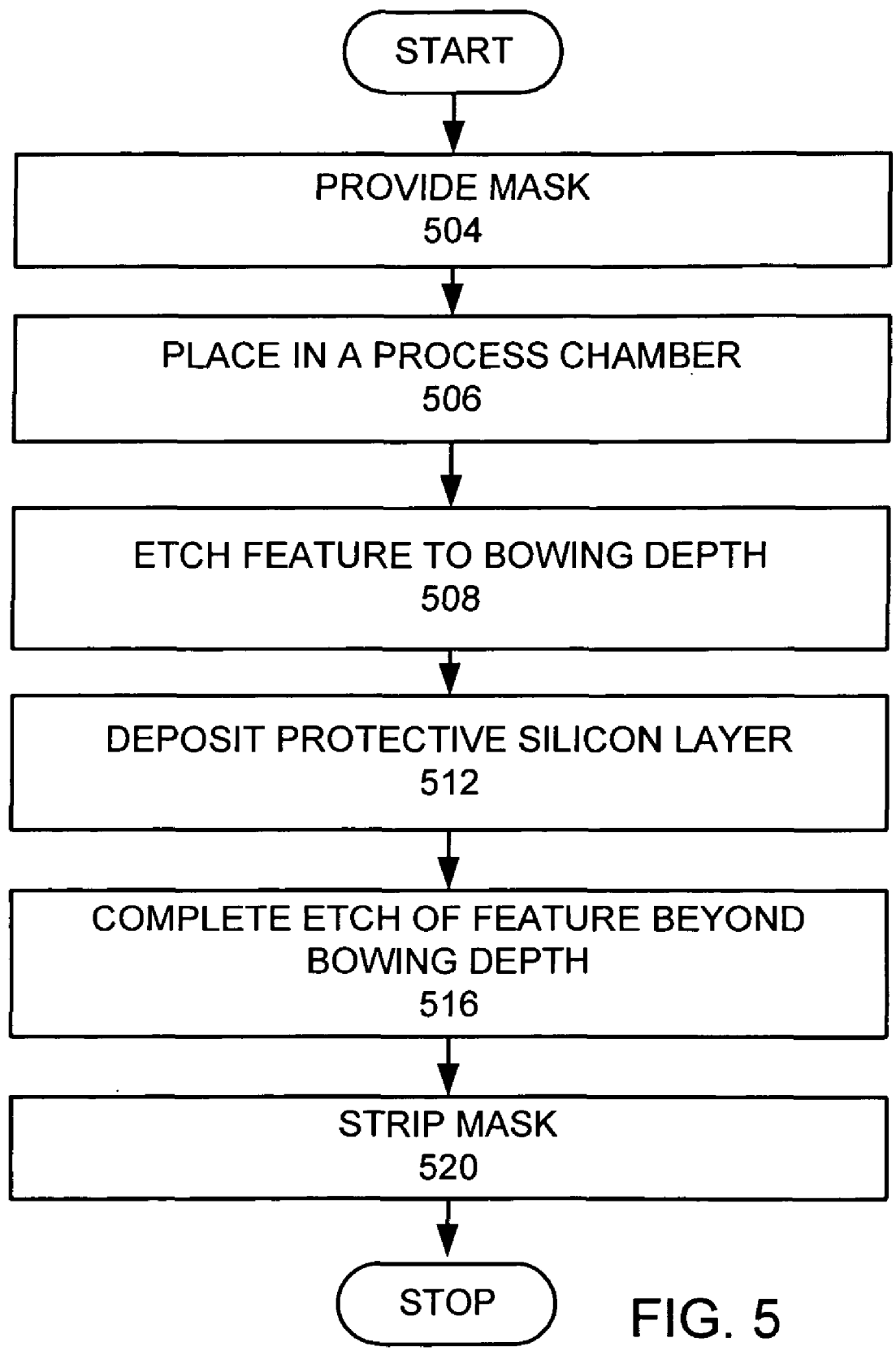
FIG. 5 is a flow chart of another embodiment of the invention.
Figure 6A:
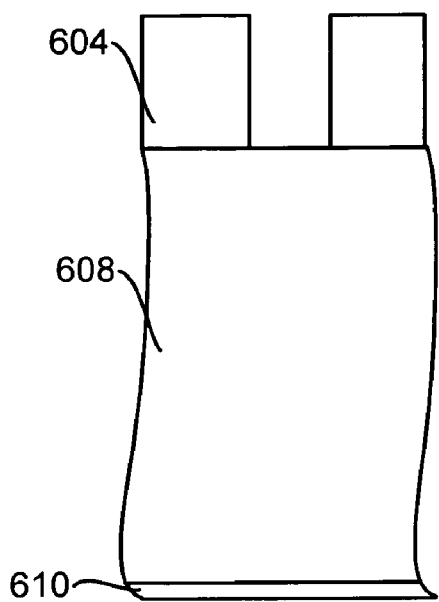
FIGS. 6A-D are schematic views of the formation of a feature using the inventive process.
Figure 6B:
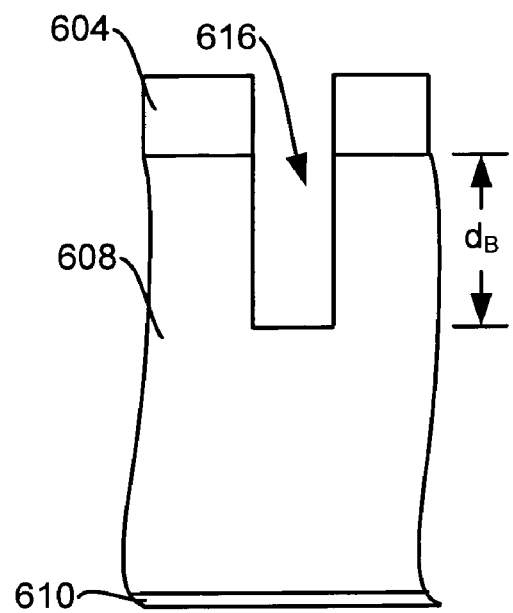
Figure 9:
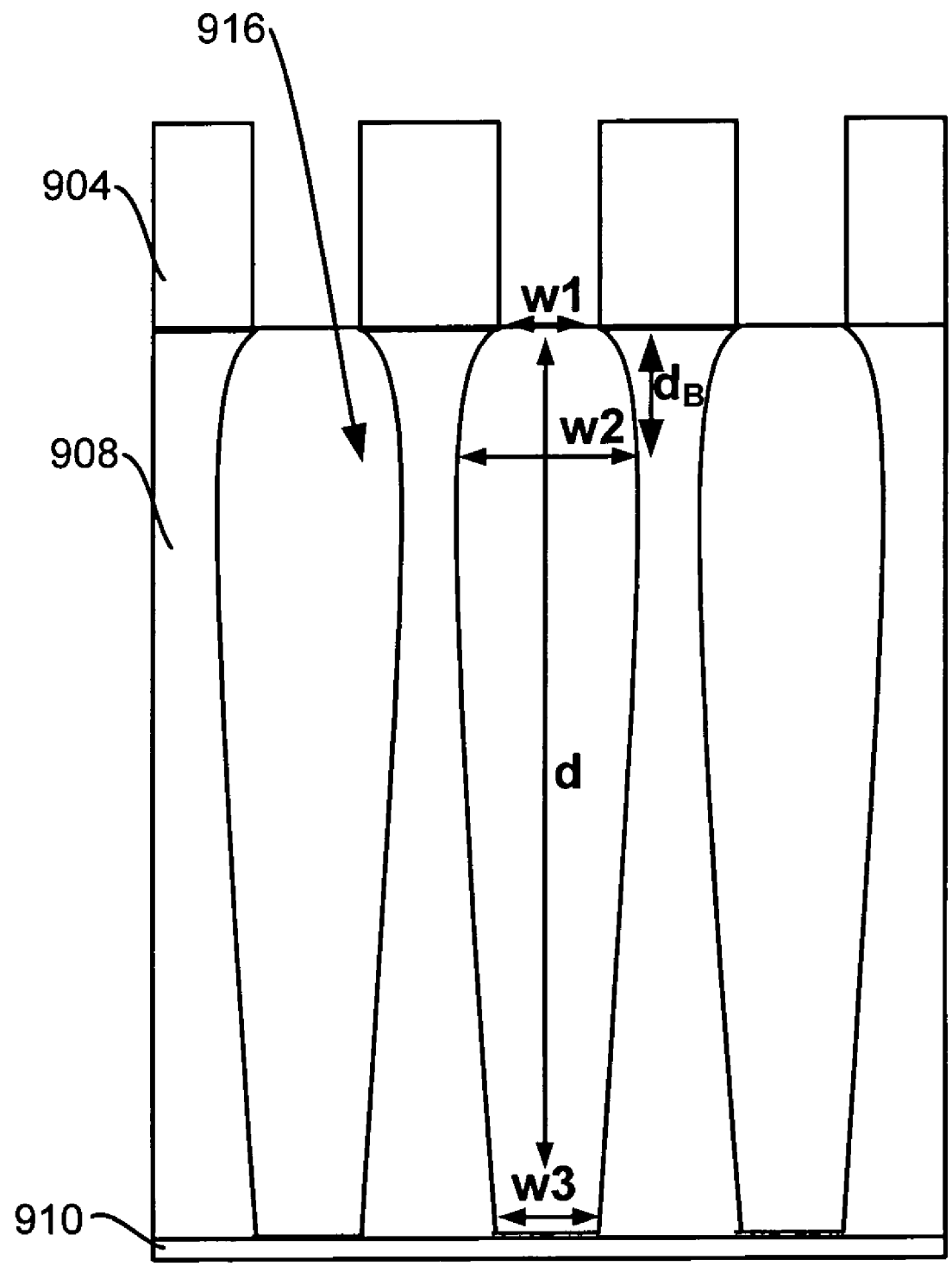
FIG. 9 is a schematic cross-sectional view of a feature etched in the prior art using a process that causes bowing.

FIG. 5 is a high level flow chart of another embodiment of the invention. In this embodiment, a photoresist mask is provided on a layer to be etched (step 504). FIG. 6A shows a photoresist mask 604, which has been provided on a dielectric layer 608 to be etched, which is over a silicon nitride barrier layer 610, which is on a substrate. The substrate is placed in a process chamber (step 506). The process chamber may be the process chamber 300 shown in FIG. 3 or another process chamber. Features are etched to a bowing depth ($d_B$) (step 508), as shown in FIG. 9. Bowing depth ($d_B$) is the depth where bowing occurs after the entire etch process(es) are completed for the desired feature/film stack. Bowing depth ($d_B$) can be determined, for example, by cross section scanning electron microscopy (SEM). In one example, bowing depths were found to be between 0.2 to 0.5 µm. However, bowing depths are dependent on the type of film stack, the etch depth, and etch time, and therefore bowing depths vary depending on different conditions.

Figure 6C:
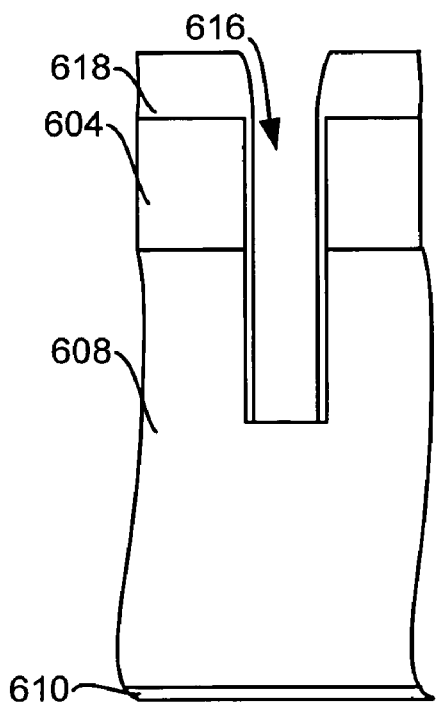
Figure 6D:
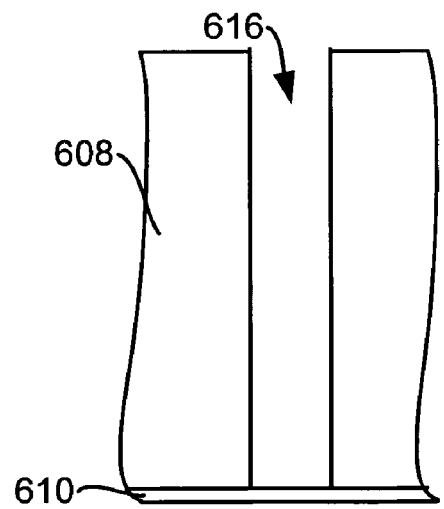

A protective silicon-containing layer 618 is deposited (step 512), as shown in FIG. 6C. In the preferred embodiment, the protective silicon layer 618 is formed by providing a deposition gas comprising $SiF_4$. A plasma is formed from the depositing gas. The plasma deposits a protective silicon-containing layer 618. As discussed in the previous embodiment, plasma parameters may be adjusted so that the silicon is selectively deposited on the top surface of the mask forming the thickest layer on the top surface of the mask. The plasma may then be less selectively deposited on the sidewalls of the feature, to form a thinner layer over the sidewalls of the feature. The plasma is least selectively deposited on the bottom of the feature. As discussed above, it is believed that the use of $SiF_4$ and the proper plasma parameters allows for no silicon deposition on the bottom of the feature 616, as shown. The etch of the feature is then completed (step 516), as shown in FIG. 5D. The mask is stripped (step 520).

Single Deposition Etch Cycle

Figure 7:
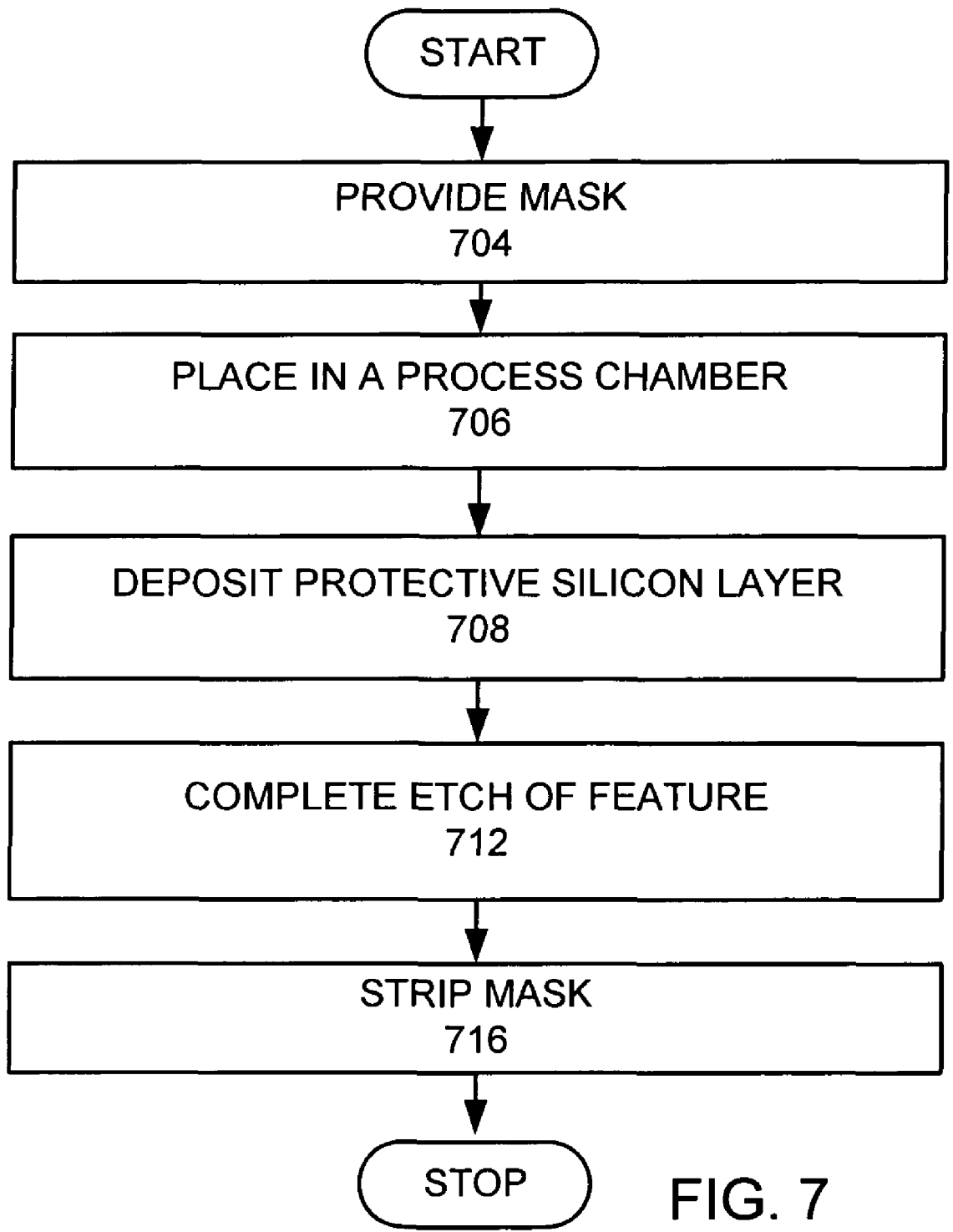
FIG. 7 is a more specific flow chart of another embodiment of the invention.
Figure 8A:
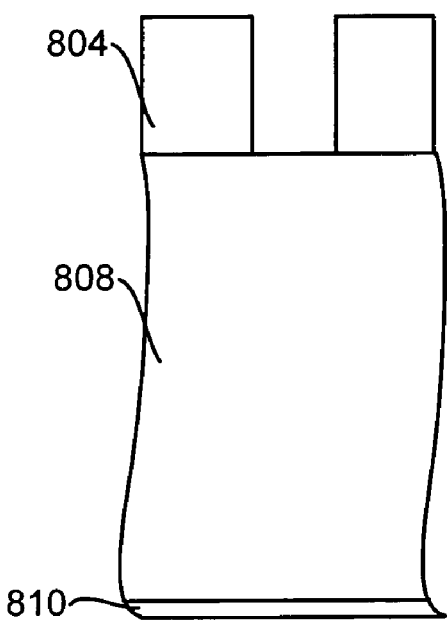
FIGS. 8A-D are schematic views of the formation of a feature using the inventive process.
Figure 8B:
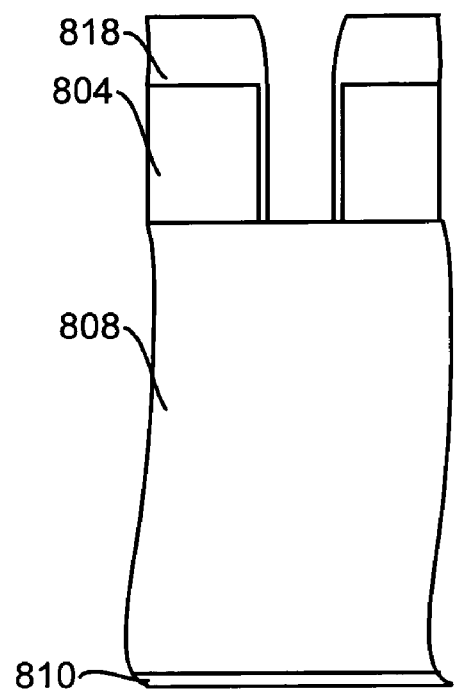

FIG. 7 is a high level flow chart of another embodiment of the invention. In this embodiment, a mask is provided on a layer to be etched (step 704). FIG. 8A shows a mask 804, which has been provided on a dielectric layer 808 to be etched, which is over a silicon nitride barrier layer 810, which is on a substrate. The substrate is placed in a process chamber (step 706). The process chamber may be the process chamber 300 shown in FIG. 3 or another process chamber. A protective silicon-containing layer 818 is deposited (708), as shown in FIG. 8B. As discussed in the previous embodiments, plasma parameters may be adjusted so that the silicon is selectively deposited on the top surface of the mask forming the thickest layer on the top surface of the photoresist. The plasma may then be less selectively deposited on the sidewalls of the mask, to form a thinner layer over the sidewalls of the mask. The plasma is least selectively deposited on the top surface of the dielectric layer. As discussed above, it is believed that the use of $SiF_4$ and the proper plasma parameters allows for no silicon deposition on the top surface of the dielectric layer 808, as shown. In this embodiment, where features have not yet been etched into the dielectric layer, the bottom of the feature is the bottom of the mask feature, which is the top surface of the dielectric layer.

Figure 8C:
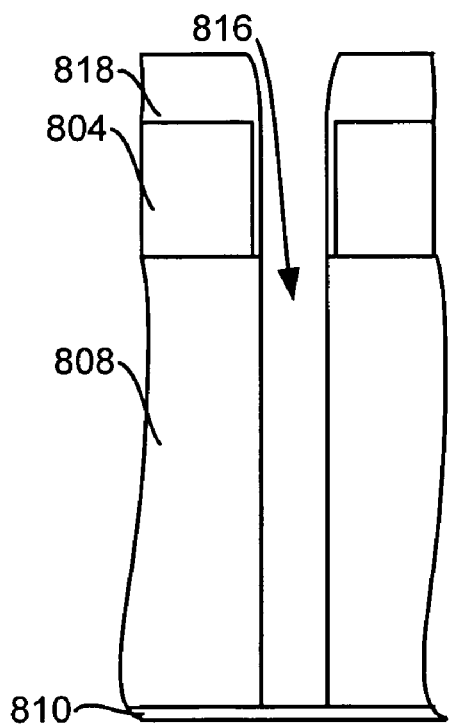
Figure 8D:
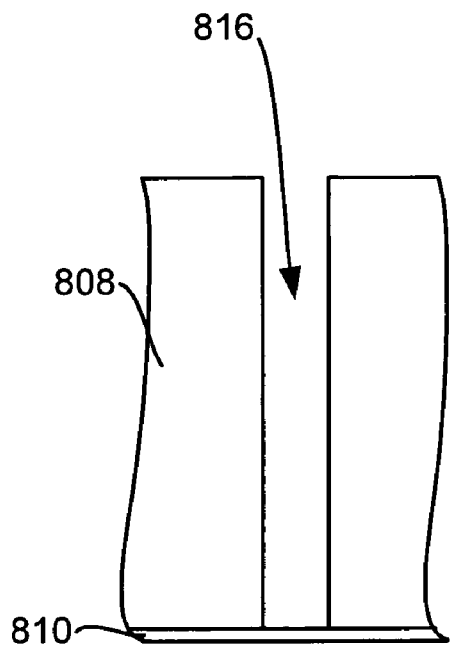

In this embodiment, a single main etch may be used to completely etch a feature 816 (step 712) to the barrier layer 810, as shown in FIG. 8C. The mask is then stripped (step 716), as shown in FIG. 8D.

In this embodiment, the protective silicon-containing layer is used to protect the mask, not for sidewall profile protection.

Advantages

In conventional PECVD, the substrate is placed on a grounded pedestal and heated to several hundred degrees ° C. The deposition plasma is sustained by RF powering the top electrode, or by using inductively coupled plasmas (ICP). Such conventional PECVD method is not applicable to common reactive ion etch (RIE) type plasma etchers, where the wafer is placed on the RF powered lower electrode, and the top electrode is typically grounded or driven by a separate frequency. Furthermore, wafer electrode heating is commonly limited to well below 100° C. due to active device thermal budget and damage concerns. $SiF_4$ based PECVD suggests that RIE mode plasma would not provide adequate deposition since the film is continuously removed by simultaneous etching and sputtering. It has been unexpectedly discovered that a robust film can be deposited at adequate rates with an RIE mode plasma under optimal conditions. Furthermore, adding an optimal amount of RF bias power (for example 2 MHz or another low frequency power, where low frequency power is defined as less than 5 MHz) can improve the deposition uniformity and film robustness. The optimal 2 MHz power is preferably 0-1000 W, or more preferably 5-500 W. Other methods of providing a low bias energy may be used. The layer to be etched may be a dielectric layer (such as silicon oxide), a conductive layer (such as metal and silicon or other type of semiconductors), or a hardmask layer (such as silicon nitride and silicon oxynitride). For etching a conductor layer, halogens, such as chlorine, fluorine, or bromine, may be used in the etching step.

Another advantage of some embodiments is that etch tapering and etch stopping are prevented.

It has also been unexpectedly found that the addition of $H_2$ to a protective layer gas comprising $SiF_4$ allows for control of the deposition process.

In the preferred embodiment of the invention, it is desirable that some of the components of the deposition gas are not mixed with components of the etch gas, since some mixing decreases the efficiency of having a separate deposition and etch process. As a result, the controller should time the gas flows so that one gas is depleted before another gas is added. In the above embodiments, $SiF_4$ is not provided during the etch.

Other inert gases instead of argon may be used as carrier gases during both the etching and deposition. An example of another inert gas would be helium, neon, and/or xenon.

In a preferred embodiment heavily polymerizing chemistry is not required during the dielectric etch. Less polymerizing etch chemistry helps to avoid tapering and etch stop.

In a preferred embodiment, typical HAR fluorocarbon etching chemistry may be used without adding a separate heavily polymerizing component such as $CH_3F$ or $CH_2F_2$.

Test Results

The following tests were performed:

Test 1. Blanket Silicon Wafer Deposition and Etch Characterization

This test demonstrates the method of using $SiF_4$ to deposit silicon-containing films on a bare silicon wafer. The following process conditions were used in this example: wafer area pressure (WAP) 100 mTorr, 500 W of 60 MHz RF, 100 sccm $SiF_4$, 190 sccm $H_2$, 225 sccm Ar, feed gas distribution 70% center weight, lower electrode temperature 60° C., upper electrode temperature 100° C., backside helium pressure 30 Torr for both the inner and outer zones, and process time 180 seconds. The deposited film was characterized by a KLA F5X ellipsometer. This test provides a silicon layer deposition with a mean thickness of 143.3 nm, a mean deposition rate of 47.8 nm/min, and 3-sigma uniformity of 11.3% over the entire wafer (16.1 nm) with a range of 19.7 nm (13.7%). The deposited film was then subjected to 60 seconds of a typical HAR oxide etch process. The etched wafer was then re-characterized by the KLA F5X ellipsometer with a new film model. As a result, the silicon layer has a mean etch rate of 57.1 nm/min, and 3-sigma uniformity of 36.5% over the entire wafer (20.8 nm/min) with a range of 27.1 nm/min (47.6%).

Test 2. Comparison of the Deposition Process with 2 MHz RF Bias

In this test, all the process conditions were the same as those in Test 1 except that 200 W of 2 MHz RF bias power was applied at the same time. This test provided a silicon layer deposition with a mean thickness of 133.3 nm, a mean deposition rate of 44.43 nm/min, and 3-sigma uniformity of 6.6% over the entire wafer (8.7 nm) with a range of 10.4 nm (7.8%). The deposited film was then subject to 60 seconds of a typical HAR oxide etch process. The etched wafer was then re-characterized by the KLA F5X ellipsometer with a new film model. As a result, the silicon layer has a mean etch rate of 46.4 nm/min, and 3-sigma uniformity of 7.5% over the entire wafer (3.5 nm/min) with a range of 5.6 nm/min (12.0%). The addition of 2 MHz RF power significantly improved both the deposition uniformity (46% reduction in 3-sigma) and resistance to HAR oxide etch (23% reduction in etch rate).

Test 3. Deposition on a Partially Etched Patterned Wafer

In this test, the same deposition process as in Test 2 was applied for 120 seconds to a wafer that was already etched by 300 seconds of a typical HAR oxide etch plasma. Cross section scanning electron microscopy (SEM) analysis results of Example 3 are given in Table 1 below. For comparison, sample with 300 seconds of etch only (Comparative Example 3a) are also analyzed and summarized in Table 1. The data indicate a dramatic (44%) reduction of the top CD without any pinch-off or bottom plugging. In fact, it was found unexpectedly the hole depth was extended by 152 nm in the course of the $SiF_4$ deposition process. This demonstrates that $SiF_4$-based deposition process is an effective method to shrink the mask CDs without causing etch stop in high aspect ratio holes.

TABLE 1

Deposition of partially etched patterned wafer

| | Comparative Example 3a: Sample with 300 seconds of HAR etch | Example 3: Sample with 300 seconds of HAR etch followed by 120 seconds of $SiF_4$ deposition |
|---|---|---|
| Top CD (nm) (cross section SEM) | 190 | 106 |
| Distance between etch front and stop layer (nm) (cross section SEM) | 377 | 225 |

Test 4. Post-deposition etch of patterned wafers

In this test, the wafers from Test 3 were further etched by 100 seconds of the same typical HAR oxide etch plasma to complete the full etch processes. The samples were then processed with an oxygen ashing plasma to remove the mask layer, and cross sectioned for SEM. The results (Example 4) are given in Table 2 below. For comparison, example 4a shows the results for a sample underwent 2-step etch (300 seconds+100 seconds) HAR etch without $SiF_4$ deposition step. As shown in the table, bowing is nearly completely eliminated in the second sample (etch-deposition-etch). The oxygen ashing plasma removes the organic mask from both samples. In contrast, the inorganic silicon-containing passivation layer survives the oxygen ashing plasma, and is clearly visible in the SEM of the second sample. This is a direct evidence that our $SiF_4$ deposition process deposit a thin layer of silicon-containing film conformally from the mask all the way deep down into the etched holes. The silicon-based sidewall passivation film is more resistant to the undesirable lateral etch, therefore minimizing bowing of the profile. This example shows applying a $SiF_4$ deposition after partial etch is an effective bow protection method.

TABLE 2

Post deposition etch of patterned wafer

| | Comparative Example 4a: Sample with 300 seconds HAR etch + 100 seconds HAR etch | Example 4: Sample with 300 seconds HAR etch, 120 seconds $SiF_4$ deposition, 100 seconds HAR etch |
|---|---|---|
| Top CD w1 (nm) (cross section SEM) | 117 | 122 |
| Bow CD w2 (nm) (cross section SEM) | 156 | 127 |

Test 5. Continuous Etch-deposition-etch Process

Figure 10:
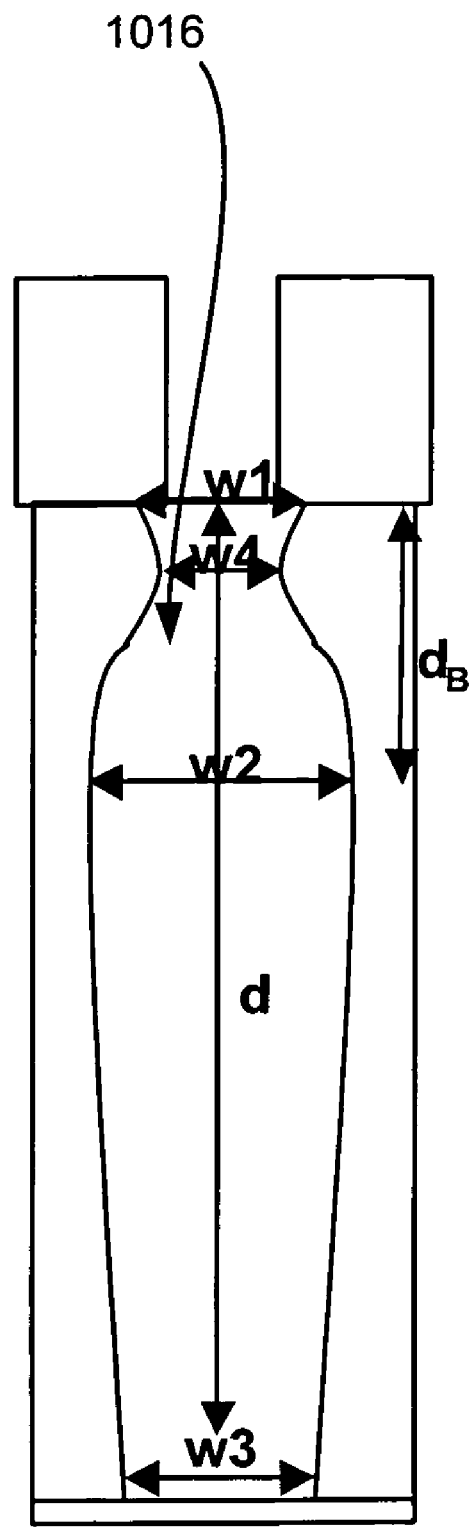
FIG. 10 is a schematic cross-sectional view of another feature etched in the prior art using a process that causes bowing.

In this test, the wafer was continuously processed with the following sequence in a single recipe: 200 seconds of the typical HAR etch, 60 seconds of $SiF_4$ deposition, and 200 seconds of the typical HAR etch. The processed wafer was then subjected to $O_2$ ashing plasma, and cross sectioned for SEM. The results are shown in Table 3 below (Example 5). In the comparative example of 400 seconds continuous etch (Example 5a), the top CD was blown out to 148 nm due to severe striation. Severe striation is a consequence of damage and distortion of the mask layer. In contrast, top down SEM of Example 5 shows striation free circular opening of the HAR holes after etch completion. Table 3 also shows more mask remained after etch when $SiF_4$ deposition step is applied during etch. In addition to top striation, comparative example 5a shows a necking (narrowing) CD (w4 in FIG. 10) of 129 nm between the top and the bow depth (see FIG. 10). In contrast, no necking is observed in the sample in which the $SiF_4$ deposition was applied during etch. This example shows that applying $SiF_4$ deposition in between the HAR etch process can not only reduce bow, but also protect the mask layer hence reduce striation, top CD blown out, and necking.

TABLE 3

Continuous etch-deposition-etch process

| | Comparative Example 5a: Sample with 400 seconds continuous HAR etch | Example 5: Sample with 200 seconds HAR etch, 60 seconds $SiF_4$ deposition, then 200 seconds HAR etch (continuous processing) |
|---|---|---|
| Top CD w1 (nm) (cross section SEM) | 148 | 127 |
| Bow CD w2 (nm) (cross section SEM) | 155 | 142 |
| Mask remaining after etch (cross section SEM) | 201 | 247 |
| Top CD (nm) (top down SEM) | 168 | 140 |

Test 6. Pre-deposition for Top CD Shrink

In this test, the wafer was first processed with 30 seconds of $SiF_4$ deposition, followed by 400 seconds of the typical HAR oxide etch in a single recipe. The results are shown in Table 4 below. For comparison, data from direct etch without $SiF_4$ pre-deposition (Comparative Example 5a) are also listed in Table 4. As shown in the table, applying 30 seconds of $SiF_4$ deposition prior to etch achieved 36 nm top CD reduction. Furthermore, there is more mask remained in the pre-etch SiF₄ deposition treated sample. This shows that SiF₄ pre-deposition protects the mask layer during etch.

TABLE 4

Pre-deposition for top CD shrink

|  | Comparative Example 5a Sample without SiF₄ pre-treatment (400 seconds of HAR etch) | Example 6: Sample with 30 seconds of SiF₄ deposition followed by 400 seconds of HAR etch |
|---|---|---|
| Top CD (nm) (top down SEM) | 168 | 132 |
| Mask remaining after etch (nm) (cross section SEM) | 201 | 256 |

Figure 11:
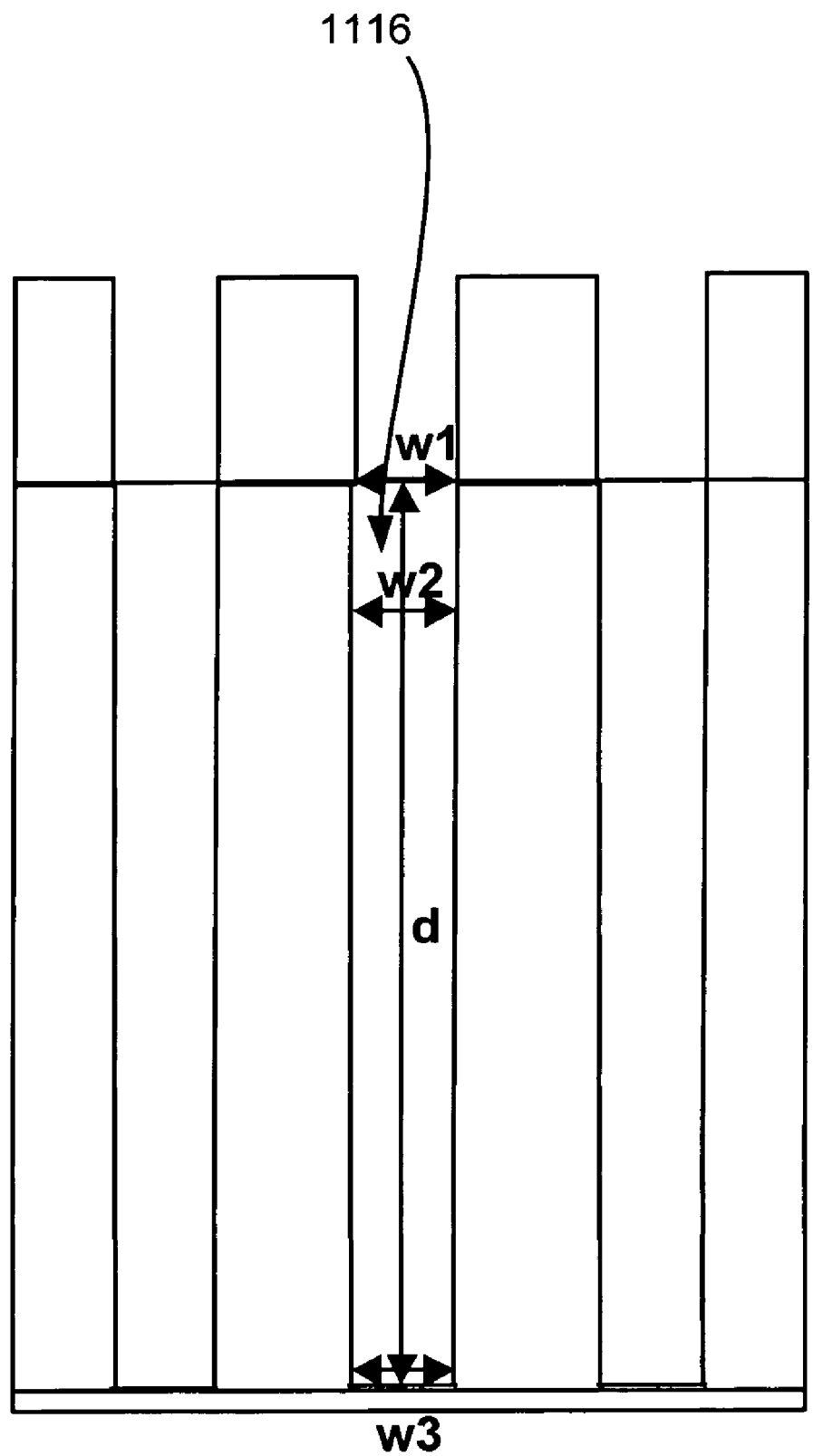
FIG. 11 is a schematic cross-sectional view of a feature etched using an embodiment of the invention.

FIG. 11 is a schematic view of features 1116 etched using one of the embodiments of the invention. As shown, the features 1116 do not have bowing, but have vertical profiles.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features in a dielectric layer comprising:
    forming a mask over the dielectric layer;
    forming a protective amorphous or polymorphous silicon-containing coating on exposed surfaces of the mask, wherein the forming the protective silicon-containing coating comprises:
        providing a protective coating gas comprising SiF₄ and H₂;
        transforming the protective coating gas into a plasma;
        depositing the protective silicon coating from the plasma; and
        stopping the protective coating gas; and
    etching the features through the mask and protective silicon-containing coating.

2. The method, as recited in claim 1, wherein the features have bottoms, wherein the forming a protective silicon-containing coating does not deposit the silicon-containing coating on the bottoms of the features.

3. The method, as recited in claim 1, wherein the etching the features through the mask and protective silicon-containing coating, comprises:
    providing a etching gas that is CH₃F and CH₂F₂ free, and forming a plasma from the etch gas, which etches the features.

4. The method, as recited in claim 3, further comprising partially etching the features into the dielectric layer to a bowing depth before forming the protective silicon coating.

5. The method, as recited in claim 3, wherein the forming the protective silicon coating and etching the feature are performed cyclically for at least three cycles.

6. The method, as recited in claim 1, wherein the depositing the protective coating comprises providing a bias power between 5 and 500 W.

7. The method, as recited in claim 6, wherein the providing a bias power comprises providing a low frequency RF signal.

8. The method, as recited in claim 7, wherein the features have vertical profiles.

9. The method, as recited in claim 1, further comprising partially etching the features into the dielectric layer to a bowing depth before forming the protective silicon coating.

10. The method, as recited in claim 1, wherein the mask is an organic material mask.

11. A method of etching features in a dielectric layer, comprising:
    forming a mask over a dielectric layer;
    partially etching features into the dielectric layer;
    forming a protective amorphous or polymorphous silicon-containing coating on sidewalls of the partially etched features, wherein the forming the protective silicon-containing coating comprises:
        providing a protective coating gas comprising SiF₄ and H₂;
        transforming the protective coating gas into a plasma;
        depositing the protective silicon coating from the plasma; and
        stopping the protective coating gas; and
    completely etching the features.

12. The method, as recited in claim 11, wherein the partially etching features etches the features to a bowing depth.

13. The method, as recited in claim 12, wherein the features have bottoms, wherein the forming a protective silicon-containing coating does not deposit the silicon-containing coating on the bottoms of the features.

14. The method, as recited in claim 13, wherein the depositing the protective coating comprises providing a bias power between 5 and 500 W.

15. The method, as recited in claim 14, wherein the providing a bias power comprises providing a low frequency RF signal.

16. The method, as recited in claim 15, wherein the features have vertical profiles.

17. The method, as recited in claim 11, wherein the mask is an organic material mask.

18. The method, as recited in claim 11, wherein the completely etching the features, comprises:
    providing a etch gas, which is CH₃F and CH₂F₂ free; and
    forming a plasma from the etch gas, which etches the features.

* * * * *